(12) United States Patent
Zhu et al.

(10) Patent No.: US 12,127,395 B2
(45) Date of Patent: Oct. 22, 2024

(54) SEMICONDUCTOR STRUCTURE AND SEMICONDUCTOR STRUCTURE MANUFACTURING METHOD

(71) Applicant: CHANGXIN MEMORY TECHNOLOGIES, INC., Hefei (CN)

(72) Inventors: Yuhan Zhu, Hefei (CN); Chuxian Liao, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/651,108

(22) Filed: Feb. 15, 2022

(65) Prior Publication Data

US 2022/0173111 A1 Jun. 2, 2022

Related U.S. Application Data

(63) Continuation of application No. PCT/CN2021/110882, filed on Aug. 5, 2021.

(30) Foreign Application Priority Data

Sep. 14, 2020 (CN) .......................... 202010962377.0

(51) Int. Cl.
*H01L 27/108* (2006.01)
*H10B 12/00* (2023.01)
(52) U.S. Cl.
CPC .......... *H10B 12/37* (2023.02); *H10B 12/482* (2023.02); *H10B 12/488* (2023.02)

(58) Field of Classification Search
CPC .... H10B 12/37; H10B 12/482; H10B 12/488; H10B 12/0335; H10B 12/033;
(Continued)

(56) References Cited

U.S. PATENT DOCUMENTS 5,525,820 A 6/1996 Furuyama
6,091,094 A 7/2000 Rupp
(Continued)

FOREIGN PATENT DOCUMENTS

CN 1248065 A 3/2000
CN 102428562 A 4/2012
(Continued)

OTHER PUBLICATIONS

International Search Report and Written Opinion as cited in PCT/CN2021/110882 mailed Oct. 14, 2021, 8 pages.
(Continued)

*Primary Examiner* — Mohammed R Alam
(74) *Attorney, Agent, or Firm* — Kilpatrick Townsend & Stockton LLP

(57) ABSTRACT

Embodiments of the present application provide a semiconductor structure and a semiconductor structure manufacturing method. The semiconductor structure includes: a wordline; and a first bitline and a second bitline located on two sides of the wordline and a first memory structure and a second memory structure located on the two sides of the wordline. The first bitline and the second bitline are connected to the first memory structure and the second memory structure respectively through a transistor. An extension direction of the first bitline is perpendicular to an extension direction of the wordline.

13 Claims, 14 Drawing Sheets

(58) Field of Classification Search
CPC .... H10B 12/036; H10B 12/315; H10B 12/33;
H10B 63/34; H10B 63/84; H10B 61/22;
H10B 12/03; H10B 12/05; H10B 53/00;
H10B 61/20; H10B 12/30
See application file for complete search history.

(56) References Cited

U.S. PATENT DOCUMENTS

| | | | |
|---|---|---|---|
| 6,699,750 | B1 | 3/2004 | Rupp |
| 7,084,029 | B2 | 8/2006 | Kundalgurki et al. |
| 7,763,924 | B2 | 7/2010 | Huang |
| 10,872,858 | B2 | 12/2020 | Liu |
| 2002/0075719 | A1 | 6/2002 | Johnson et al. |
| 2009/0289251 | A1 | 11/2009 | Kiyotoshi |
| 2013/0099305 | A1 | 4/2013 | Kim |
| 2019/0067183 | A1 | 2/2019 | Liu et al. |
| 2019/0206869 | A1* | 7/2019 | Kim ............... H01L 29/1033 |
| 2021/0183861 | A1* | 6/2021 | Lee ..................... H10B 12/03 |
| 2022/0044725 | A1 | 2/2022 | Park |

FOREIGN PATENT DOCUMENTS

| | | |
|---|---|---|
| CN | 109427787 A | 3/2019 |
| CN | 110168726 A | 8/2019 |
| CN | 110168727 A | 8/2019 |
| CN | 110504271 A | 11/2019 |
| CN | 110914983 A | 3/2020 |
| CN | 210640252 U | 5/2020 |

OTHER PUBLICATIONS

International Search Report in the international application No. PCT/CN2021/106888, mailed on Oct. 22, 2021, 6 pages.
Written Opinion cited in PCT/CN2021/106888, mailed on Oct. 22, 2021, 7 pages.
Written Opinion cited in PCT/CN2021/110882, mailed Oct. 14, 2021, 6 pages.
United States Patent and Trademark office, Non-final office action issued in related U.S. Appl. No. 17/456,091 on Jul. 30, 2024.

* cited by examiner

SEMICONDUCTOR STRUCTURE AND SEMICONDUCTOR STRUCTURE MANUFACTURING METHOD

CROSS-REFERENCE TO RELATED APPLICATIONS

This application is a continuation application of International Patent Application No. PCT/CN2021/110882, filed on Aug. 5, 2021, which claims priority to Chinese Patent Application No. 202010962377.0, filed with the Chinese Patent Office on Sep. 14, 2020 and entitled "SEMICONDUCTOR STRUCTURE AND SEMICONDUCTOR STRUCTURE MANUFACTURING METHOD." International Patent Application No. PCT/CN2021/110882 and Chinese Patent Application No. 202010962377.0 are incorporated herein by reference in their entireties.

TECHNICAL FIELD

The present application relates to the field of semiconductors, and in particular to, but is not limited to, a semiconductor structure and a semiconductor structure manufacturing method.

BACKGROUND

A memory in a semiconductor structure is a memory component configured to store data information, and a random access memory is divided into a static random access memory and a dynamic random access memory. The dynamic random access memory generally includes a capacitor and a transistor connected to the capacitor. The capacitor is configured to store charges representing stored information. The transistor is a switch that controls the charges of the capacitor to flow in and out. When data is written, a wordline provides a high level, the transistor is turned on, and the capacitor is charged through a bitline. When the data is read, the wordline also provides a high level, the transistor is turned on, the capacitor discharges, and the bitline receives a read signal.

However, with the continuous development of a memory technology, it is increasingly difficult to increase storage capacity by reducing a size of a memory.

SUMMARY

Embodiments of the present application provide a semiconductor structure and a semiconductor structure manufacturing method.

According to some embodiments, in one aspect, the present application provides a semiconductor structure, including: a wordline; and a first bitline and a second bitline located on two sides of the wordline and a first memory structure and a second memory structure located on the two sides of the wordline, the first bitline and the second bitline being connected to the first memory structure and the second memory structure respectively through a transistor; an extension direction of the first bitline being perpendicular to an extension direction of the wordline.

According to some embodiments, in another aspect, the present application further provides a semiconductor structure manufacturing method, including: providing a substrate, and forming a first memory structure on the substrate; forming a second bitline on the first memory structure; forming a transistor and a wordline on the second bitline, the transistor including a source, a drain and a channel region, the channel region of the transistor being connected to the wordline; forming a first bitline on the transistor and the wordline; and forming a second memory structure on the first bitline, wherein the first bitline and the second bitline are connected to the first memory structure and the second memory structure respectively through the transistor; and an extension direction of the first bitline is perpendicular to an extension direction of the wordline.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

The embodiments of the present application provide a semiconductor structure and a semiconductor structure manufacturing method. The semiconductor structure has a first memory structure and a second memory structure located on two sides of a wordline and a first bitline and a second bitline located on the two sides of the wordline, an extension direction of the first bitline is the same as an extension direction of the second bitline, and the extension direction of the first bitline is perpendicular to an extension direction of the wordline. Therefore, mutual interference between the wordline and the first bitline and between the wordline and the second bitline can be reduced while the storage capacity is increased, thereby improving the stability of a memory.

In order to make the objectives, technical solutions and advantages of the embodiments of the present application clearer, various embodiments of the present application will be described below in detail with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

Figure 1:
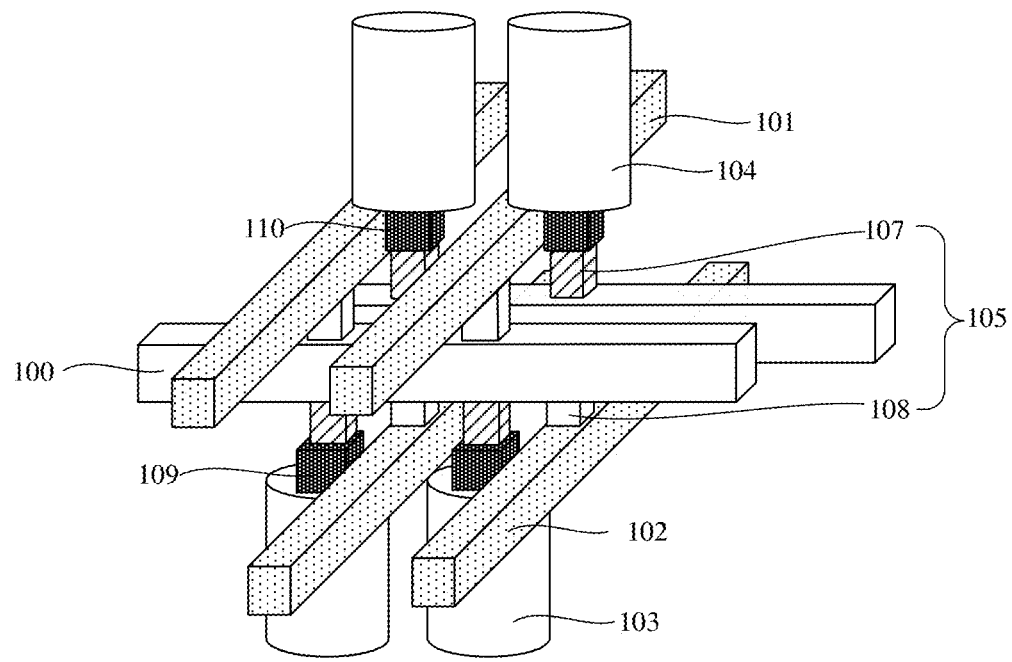
FIG. 1 is a schematic diagram of a semiconductor structure according to a first embodiment of the present application.

A first embodiment of the present application provides a semiconductor structure. FIG. 1 is a schematic diagram of a semiconductor structure according to this embodiment.

Referring to FIG. 1, the semiconductor structure includes: a wordline 100; and a first bitline 101 and a second bitline 102 located on two sides of the wordline 100 and a first memory structure 103 and a second memory structure 104 located on the two sides of the wordline 100. The first bitline 101 and the second bitline 102 are connected to the first memory structure 103 and the second memory structure 104 respectively through a transistor 105. An extension direction of the first bitline 101 is perpendicular to an extension direction of the wordline 100.

A detailed description is provided below with reference to the accompanying drawings.

Referring to FIG. 1, the transistor 105 is a vertical transistor, a middle of the transistor 105 is coated with the wordline 100, and the wordline 100 is connected to a channel region (not shown in the drawing) of the transistor 105 and configured to control ON and OFF of the transistor 105.

A source 107 and a drain 108 are at two ends of the transistor 105.

The transistor 105 includes a first transistor and a second transistor, two ends of the first transistor are connected to the first bitline 101 and the first memory structure 103 respectively, and two ends of the second transistor are connected to the second bitline 102 and the second memory structure 104 respectively.

In an optional embodiment, the source of the first transistor is connected to the first memory structure 103, and the drain of the first transistor is connected to the first bitline 101. The source 107 of the second transistor is connected to the second memory structure 104, and the drain 108 of the second transistor is connected to the second bitline 102.

In an optional embodiment, the drain of the first transistor may also be connected to the first memory structure, and the source of the first transistor is connected to the first bitline. The drain of the second transistor may also be connected to the second memory structure, and the source of the second transistor is connected to the second bitline.

The first bitline 101 and the second memory structure 104 are located on one side of the transistor 105, and the second bitline 102 and the first memory structure 103 are located on the other side of the transistor 105.

When the first memory structure 103 and the second memory structure 104 are located on two sides of the transistor 105, a number of the memory structures can be increased, thereby obtaining greater storage capacity.

In an optional embodiment, the second bitline 102 and the first memory structure 103 are located on different layers, and the first bitline 101 and the second memory structure 104 are located on different layers; and the second bitline 102 is located on one layer closer to the transistor 105 than the first memory structure 103. The first bitline 101 is located on one layer closer to the transistor 105 than the second memory structure 104. In other embodiments, the second memory structure may be located on one layer closer to the transistor than the first bitline, and the first memory structure may be located on one layer closer to the transistor than the second bitline.

In an optional embodiment, the transistor 105 connected to a same wordline 100 is connected to one of the first memory structure 103 and the second memory structure 104.

In an optional embodiment, a plurality of wordlines 100 are located in a same layer, a plurality of first bitlines 101 and a plurality of second memory structures 104 are located on one side of the layer where the wordlines 100 are located, and a plurality of second bitlines 102 and a plurality of first memory structures 103 are located on the other side of the layer where the wordlines 100 are located; and the plurality of first bitlines 101 are located in a same layer, the plurality of second memory structures 104 are located in a same layer, the plurality of second bitlines 102 are located in a same layer, and the plurality of first memory structures 103 are located in a same layer. The same wordline 100 is connected to a plurality of transistors 105, and the transistors 105 connected to the same wordline 100 are connected to only the first memory structures 103 or only the second memory structures 104. Correspondingly, the transistors 105 connected to the same wordline 100 are connected to only the first bitlines 101 or the second bitlines 102.

In an optional embodiment, the wordlines 100 corresponding to the first memory structures 103 are arranged alternately with the wordlines 100 corresponding to the second memory structures 104.

In an optional embodiment, the plurality of wordlines 100 are arranged in parallel with an equal spacing in the same layer, and the wordlines 100 corresponding to the first memory structures 103 are arranged alternately with the wordlines 100 corresponding to the second memory structures 104. Therefore, the arrangement between the plurality of first memory structures 103 and the arrangement between the plurality of second memory structures 104 are more dense, the internal space of the memory is more efficiently utilized, and greater storage capacity is obtained. In other embodiments, the wordlines corresponding to the first memory structures may not be arranged alternately with the wordlines corresponding to the second memory structures; that is, a plurality of wordlines corresponding to the first memory structures are arranged adjacently or a plurality of wordlines corresponding to the second memory structures are arranged adjacently.

Understandably, in an optional embodiment, adjacent transistors connected to a same wordline are connected to the first memory structure and the second memory structure respectively; that is, the same wordline corresponds to both the first memory structure and the second memory structure. Correspondingly, the same wordline corresponds to both the first bitline and the second bitline.

In an optional embodiment, in other embodiments, the transistor connected to the first memory structure and the transistor connected to the second memory structure are staggered.

In an optional embodiment, orthographic projections of the first memory structure 103 and the second memory structure 104 on a plane where the wordlines 100 are arranged are staggered with or separated from each other to further increase the arrangement density.

In an optional embodiment, an extension direction of the first bitline 101 is the same as an extension direction of the second bitline 102, and an extension direction of the wordline 100 forms an angle of 90 degrees relative to the extension direction of the first bitline 101. The extension direction of the wordline 100 also forms an angle of 90 degrees relative to the extension direction of the second bitline 102. When the extension direction of the first bitline 101 is the same as the extension direction of the second bitline 102, the process can be simplified and design difficulty can be reduced. When an angle between the wordline 100 and the first bitline 101 is 90 degrees, an area of overlap of the wordline 100 with the first bitline 101 and the second bitline 102 can be reduced, so as to reduce mutual interference between the wordline 100 and the first bitline 101 and between the wordline 100 and the second bitline 102. In this way, the memory can still maintain good stability even if the structures inside the memory are closely arranged.

In an optional embodiment, the semiconductor structure according to the present application further includes: a first memory node contact 109 and a second memory node contact 110. The first memory structure 103 is connected to the source 107 or the drain 108 of the transistor 105 through the first memory node contact 109, and the second memory structure 104 is connected to the source 107 or the drain 108 of the transistor 105 through the second memory node contact 110.

In an optional embodiment, the first memory node contact 109 and the second bitline 102 are on a same layer, and the second memory node contact 110 and the first bitline 101 are on a same layer. In this way, the internal space of the memory can be further fully utilized, and a volume of the memory is reduced. In other embodiments, the first memory node contact may not be on a same layer as the second bitline, and the second memory node contact may not be on a same layer as the first bitline.

In an optional embodiment, the semiconductor structure according to the present application further includes: a first bitline node contact (not shown in the drawing) and a second bitline node contact (not shown in the drawing). The first bitline 101 is connected to the source 107 or the drain 108 of the transistor 105 through the first bitline node contact, and the second bitline 102 is connected to the source 107 or the drain 108 of the transistor 105 through the second bitline node contact.

In an optional embodiment, the source 107 and the drain 108 of the transistor 105 are made of an N-type semiconductor material or a P-type semiconductor material.

The wordline 100 is made of tantalum, tungsten, tantalum nitride, titanium nitride or other low-resistance metals.

The first bitline 101 includes structures such as a conductive layer, an insulation layer and a bitline contact layer. The conductive layer is made of a conductive material such as tantalum, tungsten, tantalum nitride or titanium nitride. The bitline contact layer is made of a conductive material such as polysilicon. The insulation layer is made of an insulation material such as silicon nitride or silicon carbonitride.

The second bitline 102 includes structures such as a conductive layer, an insulation layer and a bitline contact layer. The conductive layer is made of a conductive material such as tantalum, tungsten, tantalum nitride or titanium nitride. The bitline contact layer is made of a conductive material such as polysilicon. The insulation layer is made of an insulation material such as silicon nitride or silicon carbonitride.

In an optional embodiment, the first bitline 101 and the second bitline 102 are the same in structure and material.

In an optional embodiment, the first bitline and the second bitline may also be different in structure and material.

The first memory structure 103 may be a capacitive memory structure, a magnetic memory structure, a resistive memory structure, a ferroelectric memory structure or the like.

The second memory structure 104 may be a capacitive memory structure, a magnetic memory structure, a resistive memory structure, a ferroelectric memory structure or the like.

In an optional embodiment, the first memory structure 103 and the second memory structure 104 are the same. In other embodiments, the first memory structure and the second memory structure may also be different.

The first memory node contact 109 is made of a conductive material, such as polysilicon or silicon germanium.

The second memory node contact 110 is made of a conductive material, such as polysilicon or silicon germanium.

In an optional embodiment, the first memory node contact 109 and the second memory node contact 110 are the same in material.

In an optional embodiment, the first memory node contact and the second memory node contact may also be different in material.

The first bitline node contact is made of a conductive material, such as polysilicon or silicon germanium.

The second bitline node contact is made of a conductive material, such as polysilicon or silicon germanium.

In an optional embodiment, the first bitline node contact and the second bitline node contact are the same in material.

In an optional embodiment, the first bitline node contact and the second bitline node contact may also be different in material.

Based on the above, the semiconductor structure according to this embodiment has the first memory structure 103 and the second memory structure 104 located on two sides of the wordline 100 respectively and the first bitline 101 and the second bitline 102 located on the two sides of the wordline 100 respectively; and the wordline 100 corresponding to the first memory structure 103 and the wordline 100 corresponding to the second memory structure 104 are arranged alternately; and the extension direction of the wordline is perpendicular to the extension direction of the first bitline. In this way, the internal space of the memory can be fully utilized, the storage capacity is increased, mutual interference between the wordline and the first bitline is reduced, and the stability of the memory is improved.

A second embodiment of the present application provides a semiconductor structure manufacturing method. The manufacturing method may be used to manufacture the semiconductor structure in the first embodiment. FIG. 2 to FIG. 28 are schematic structural diagrams corresponding to steps of the method. A detailed description is provided below with reference to the accompanying drawings.

Figure 2:
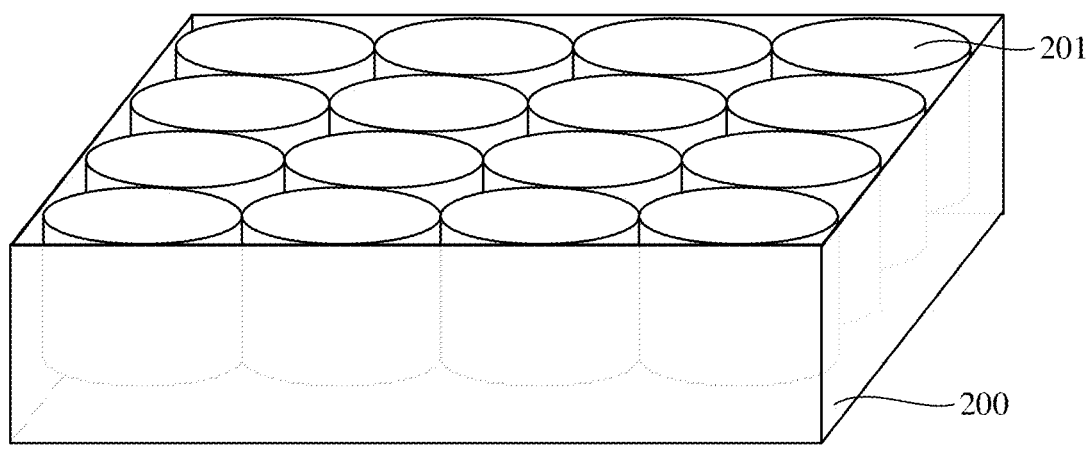
FIG. 2 to FIG. 28 are schematic structural diagrams corresponding to steps of a semiconductor structure manufacturing method according to a second embodiment of the present application.
Figure 3:
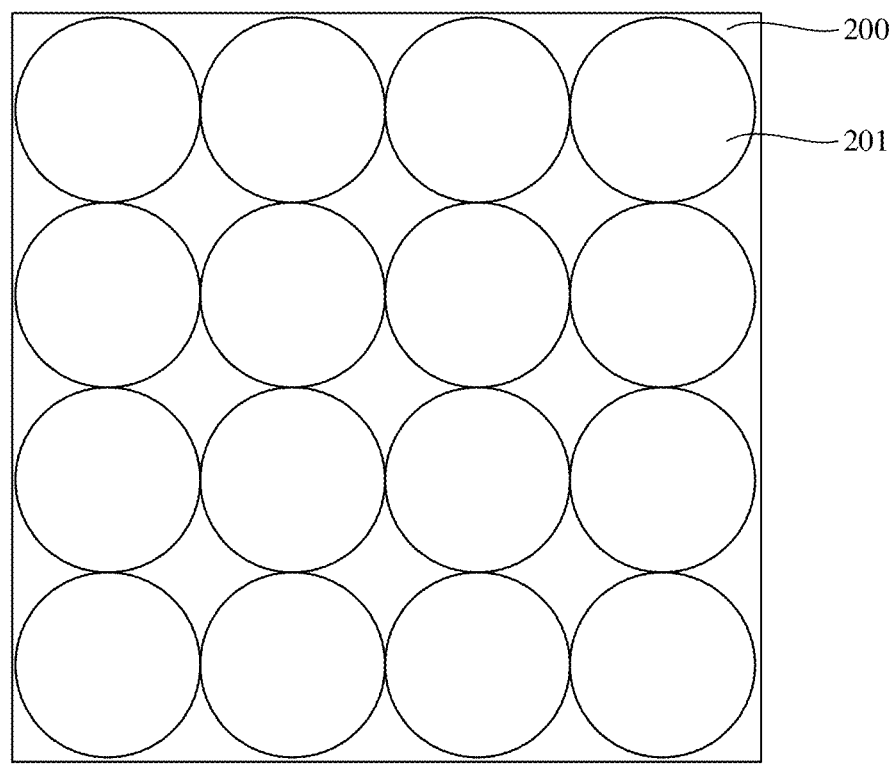

Referring to FIG. 2 and FIG. 3, FIG. 3 is a top view of the semiconductor structure of FIG. 2. A substrate 200 is provided, and a first memory structure 201 is formed on the substrate 200.

The substrate 200 may be made of an insulation material, such as silicon oxide or silicon nitride. The substrate 200 may also be made of a semiconductor material, such as monocrystalline silicon, gallium nitride or gallium arsenide.

The first memory structure 201 may be a capacitive memory structure, a magnetic memory structure, a resistive memory structure, a ferroelectric memory structure or the like. A capacitor structure may be a trench capacitor, including structures such as an upper electrode plate, a lower electrode plate and a dielectric layer.

Figure 4:
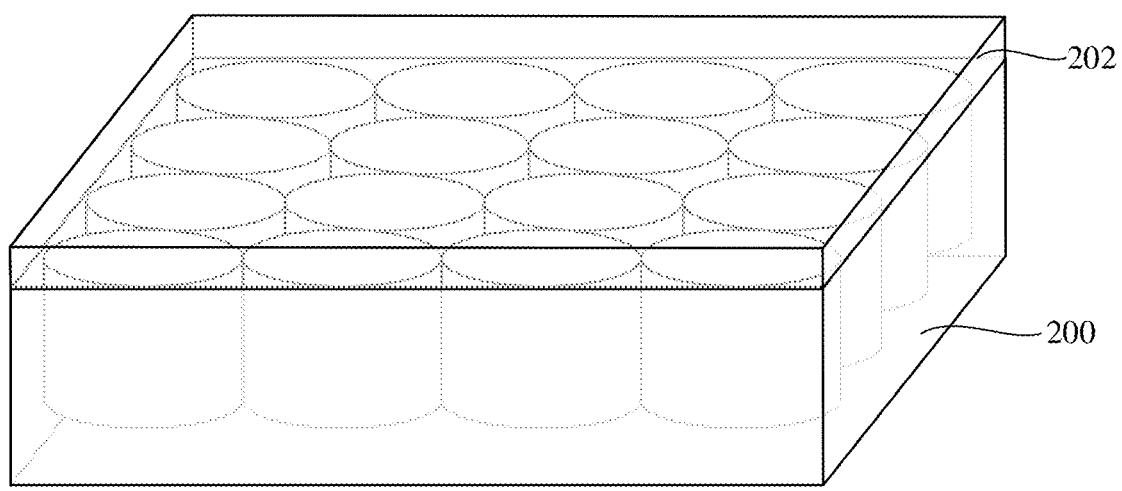
Figure 5:
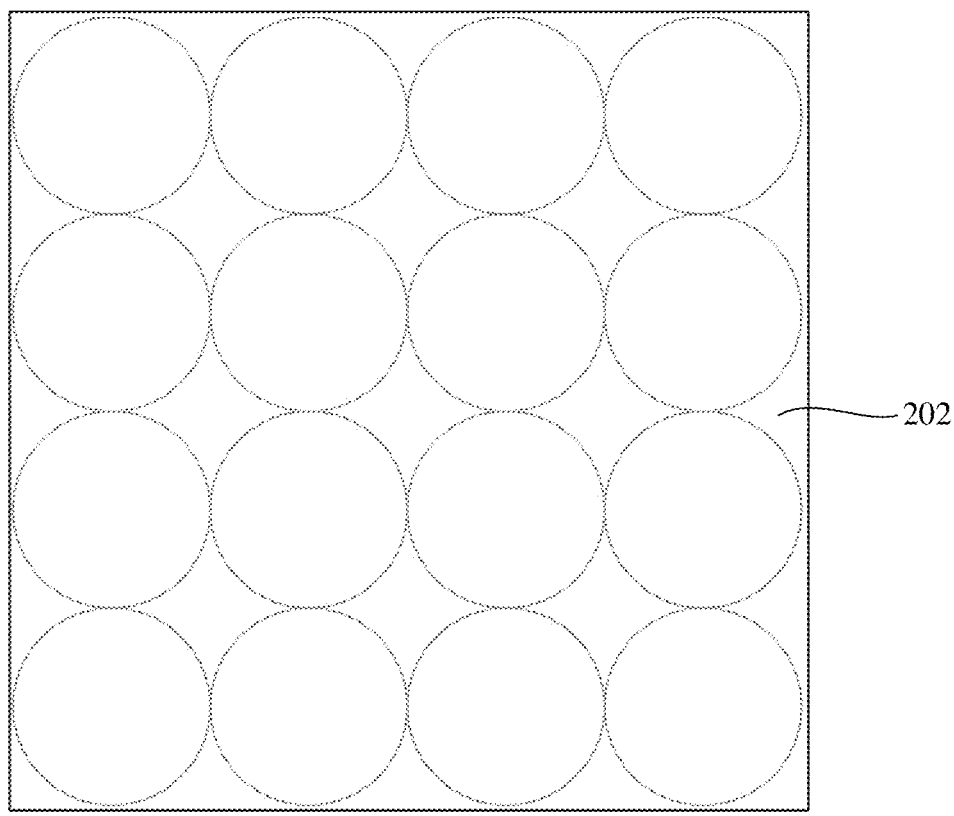
Figure 6:
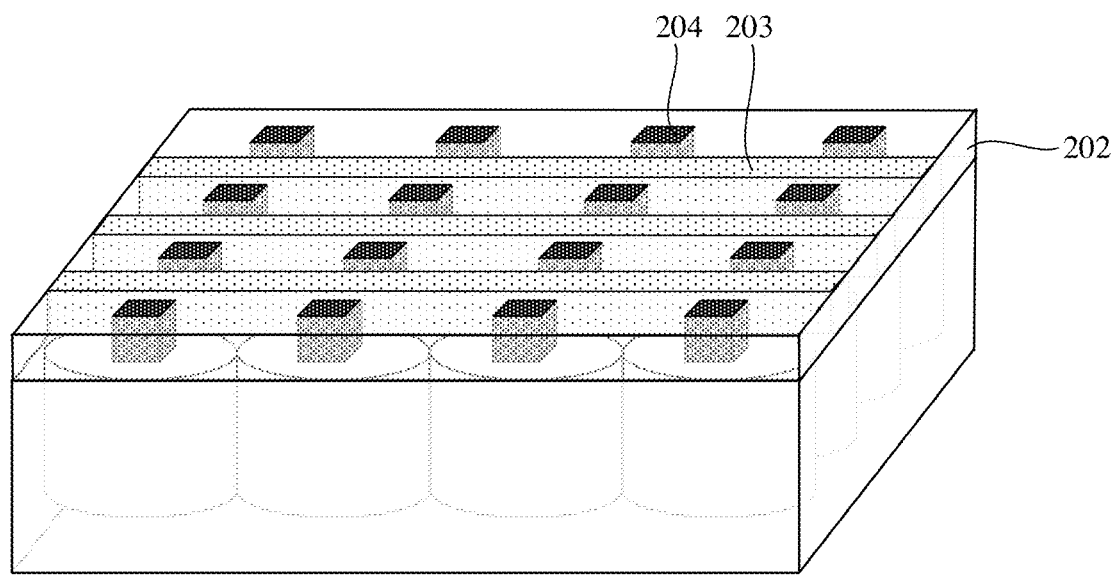
Figure 7:
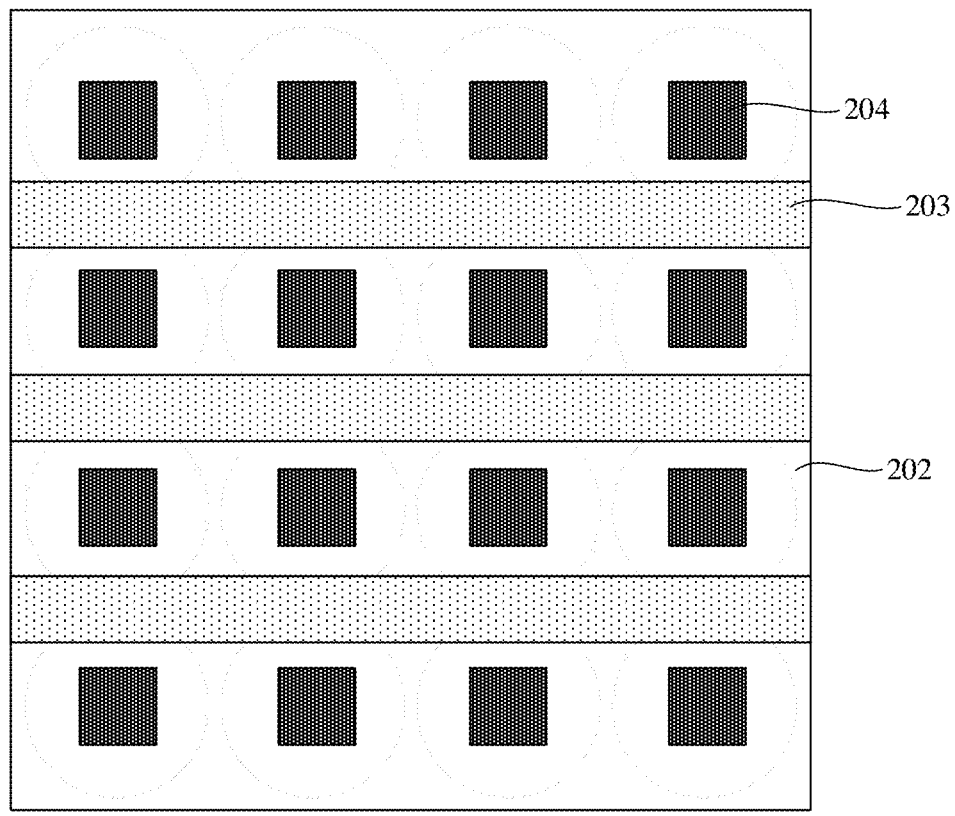

Referring to FIG. 4 to FIG. 7, FIG. 5 is a top view of the semiconductor structure of FIG. 4, and FIG. 7 is a top view of the semiconductor structure of FIG. 6. A second bitline 203 is formed on the first memory structure 201 (refer to FIG. 2 to FIG. 3). A first memory node contact 204 is formed on the first memory structure 201.

The step of forming a second bitline 203 includes: forming a second insulation layer 202 on the first memory structure 201, forming a second trench on the second insulation layer 202, and forming the second bitline 203 in the second trench.

Specifically, referring to FIG. 4 and FIG. 5, a layer of insulation material is deposited on the first memory structure 201 to form the second insulation layer 202.

In this embodiment, the second insulation layer 202 is formed by chemical vapor deposition or physical vapor deposition, which has a high deposition speed. In other embodiments, other deposition technologies may also be adopted. The second insulation layer 202 may be made of silicon dioxide, silicon nitride or silicon carbonitride.

Referring to FIG. 6 and FIG. 7, a second trench is formed on the second insulation layer 202, the second trench is filled, and the second bitline 203 is formed in the second trench.

The step of forming a first memory node contact 204 includes: forming a contact hole on the second insulation layer 202, and filling the contact hole with a conductive material such as polysilicon to form the first memory node contact 204. The first memory node contact 204 is electrically connected to the first memory structure 201.

In an optional embodiment, the first memory node contact 204 is located on a central axis of the first memory structure 201, the first memory node contacts 204 are arranged in an equally-spaced array, the second bitlines 203 are arranged in parallel with an equal spacing, and the second bitlines 203 and the first memory node contacts 204 are distributed alternately. Such an arrangement can increase the arrangement density of the memory structures and then increase the storage capacity.

Referring to FIG. 8 to FIG. 23, a transistor 209 (refer to FIG. 28) and a wordline 205 are formed on the second bitline 203 (refer to FIG. 6 to FIG. 7), and the transistor 209 includes a source 207, a drain 208 and a channel region (not shown in the drawing). The channel region is located between the source 207 and the drain 208, and the wordline 205 is connected to the channel region of the transistor 209 and configured to control ON and OFF of the transistor 209.

Figure 8:
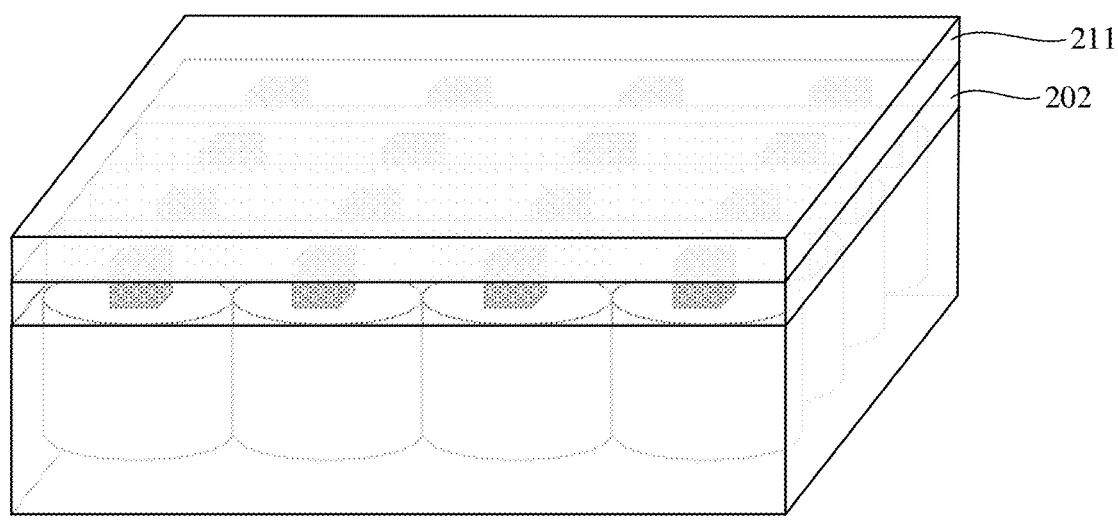
Figure 9:
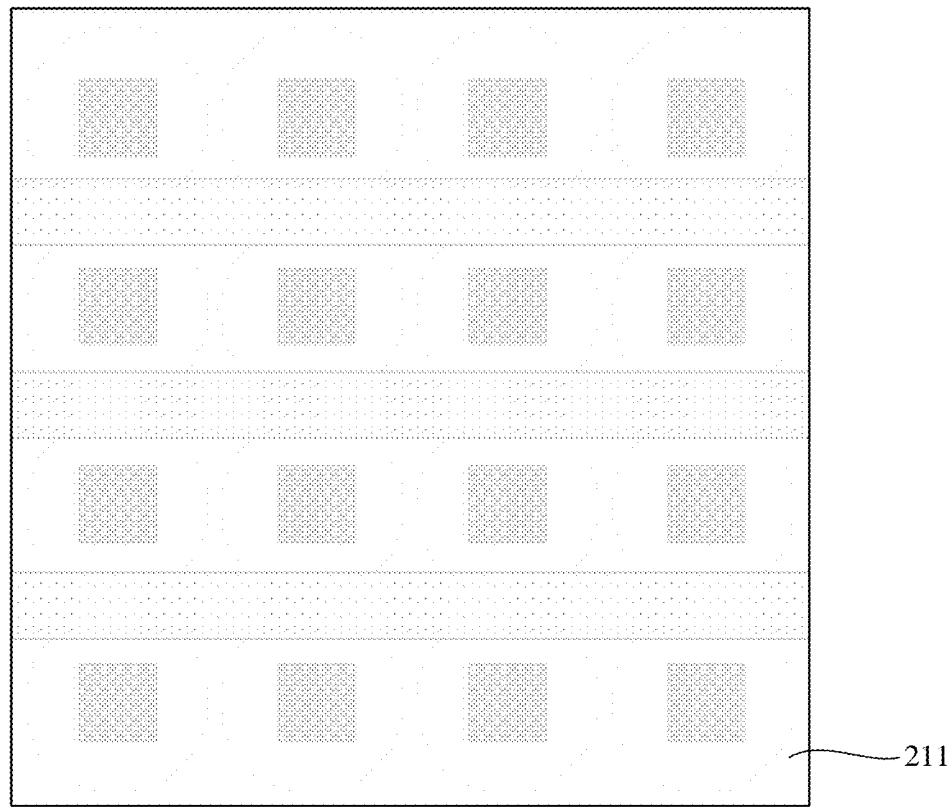

In an optional embodiment, referring to FIG. 8 and FIG. 9, FIG. 9 is a top view of the semiconductor structure of FIG. 8. A silicon layer 211 is formed on the second insulation layer 202.

Figure 10:
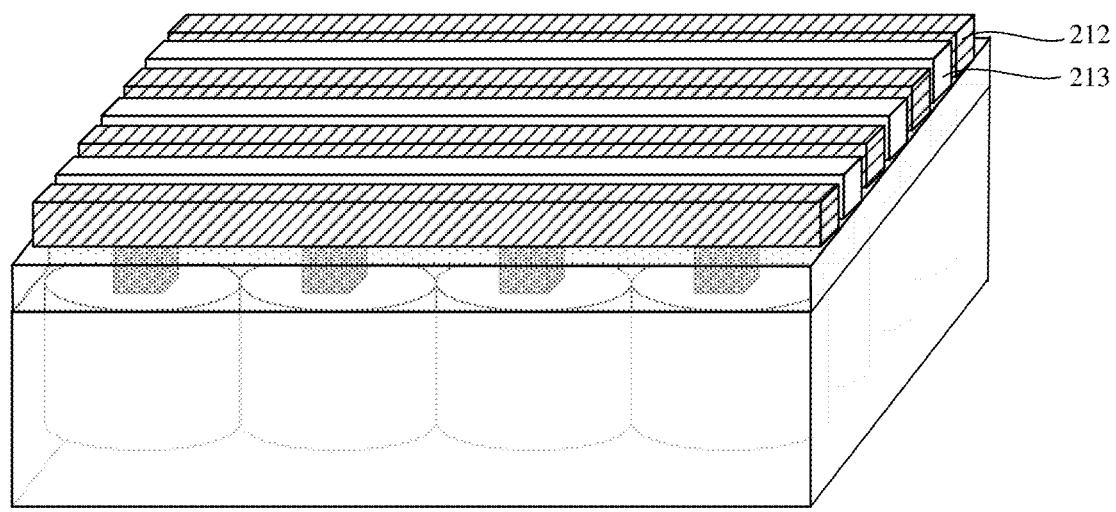
Figure 11:
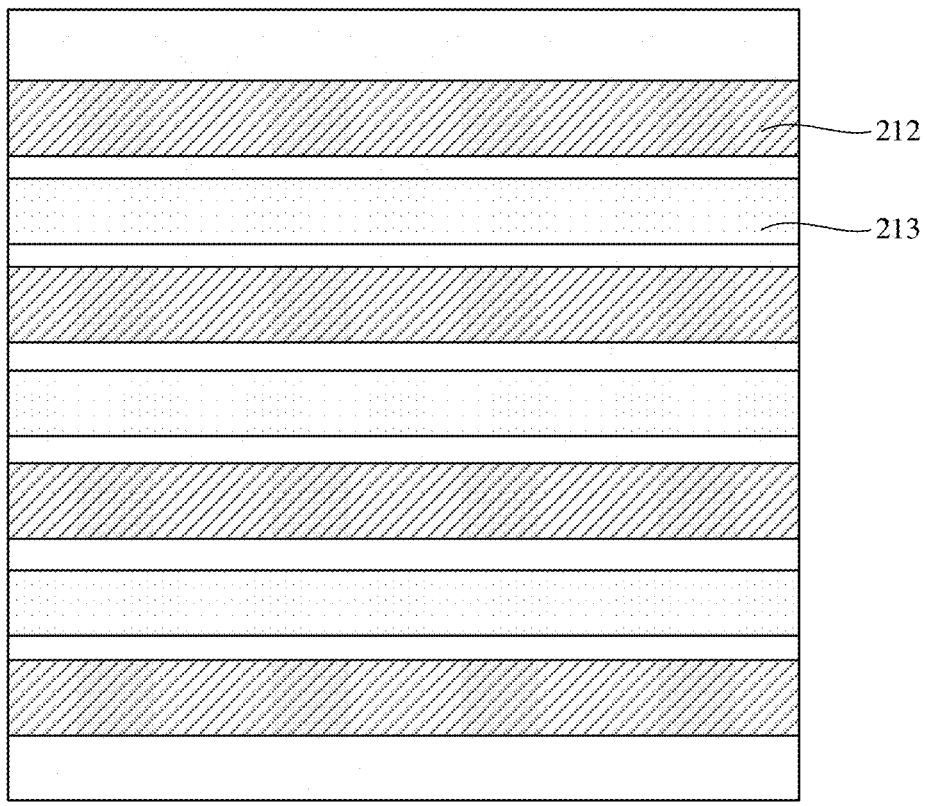

Referring to FIG. 10 and FIG. 11, FIG. 11 is a top view of the semiconductor structure of FIG. 10. A plurality of separate stripe structures are formed, and source and drain ion implantation is performed on the stripe structures to form initial source stripe structures 212 and initial drain stripe structures 213. The initial source stripe structures 212 and the initial drain stripe structures 213 are arranged alternately.

In an optional embodiment, source ions and drain ions are the same in variety and concentration. The initial source stripe structure 212 and the initial drain stripe structure 213 formed are N-type semiconductor structures or P-type semiconductor structures. The initial source stripe structure 212 is located above the first memory node contact 204, and the initial drain stripe structure 213 is located above the second bitline 203.

Figure 12:
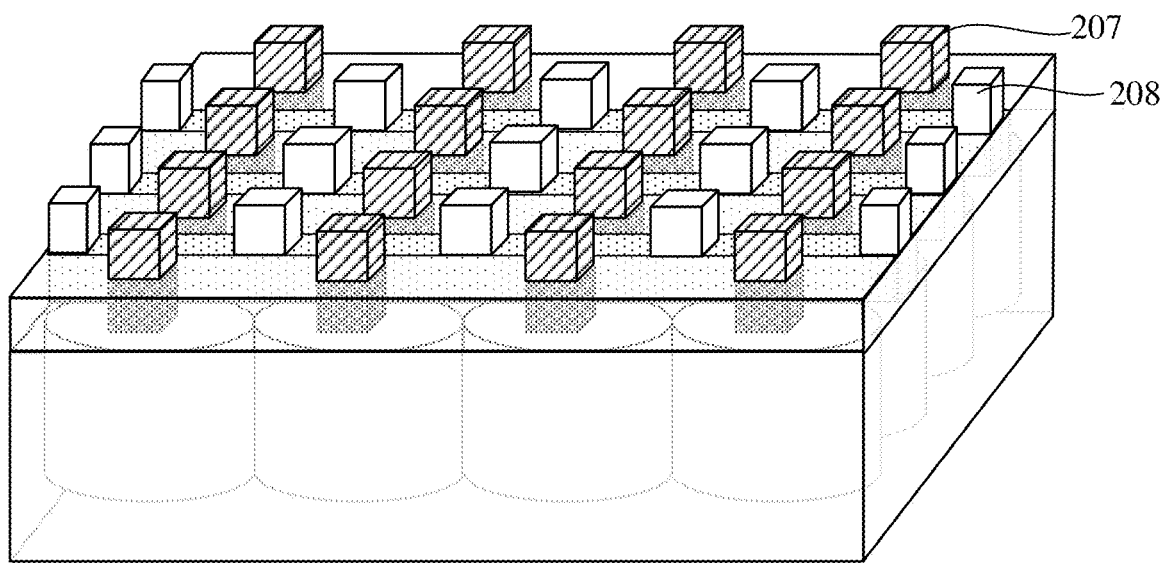
Figure 13:
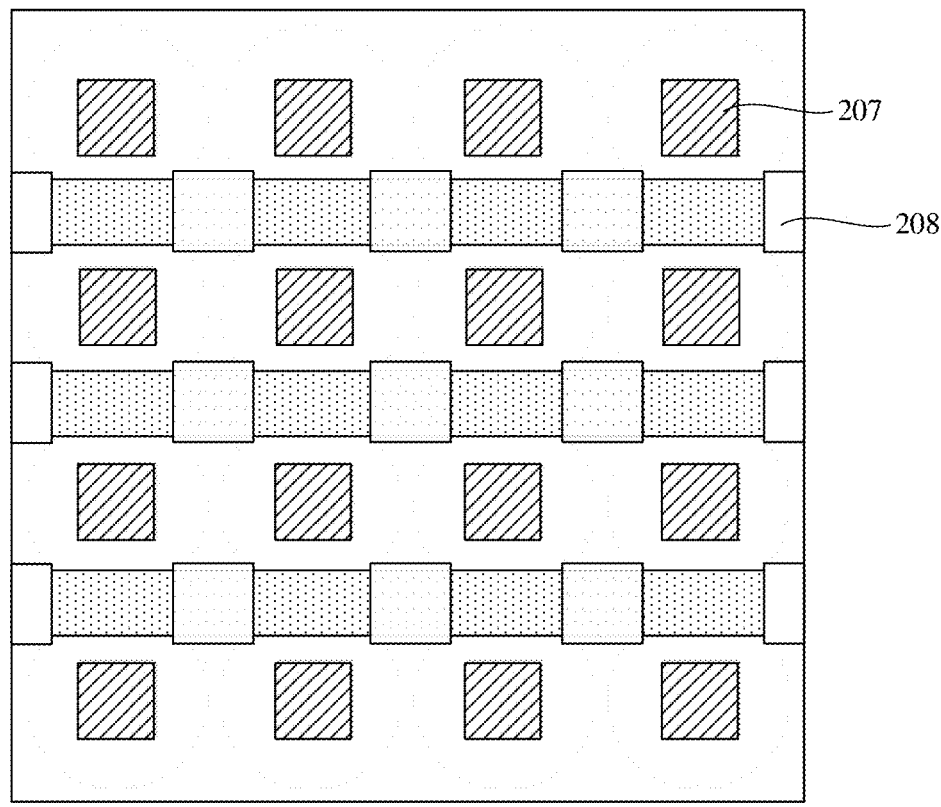

Referring to FIG. 12 and FIG. 13, FIG. 13 is a top view of the semiconductor structure of FIG. 12. The initial source stripe structure 212 and the initial drain stripe structure 213 are patterned to form the source 207 and the drain 208 of independent columnar structures.

In an optional embodiment, the source 207 at a lower end of the transistor 209 (refer to FIG. 28) is electrically connected to the first memory node contact 204 (refer to FIG. 6 to FIG. 7), and the drain 208 at a lower end of another transistor 209 is electrically connected to the second bitline 203 (refer to FIG. 6 to FIG. 7). In other embodiments, the source at the lower end of the transistor may also be electrically connected to the second bitline, and the drain at the lower end of another transistor may also be electrically connected to the first memory node contact.

In an optional embodiment, referring to FIG. 14 to FIG. 21, the step of forming a wordline 205 includes: forming a semiconductor pillar 214 on the source 207 (refer to FIG. 12 to FIG. 13) or the drain 208 (refer to FIG. 12 to FIG. 13) at one end of the transistor 209 (refer to FIG. 28); forming a gate dielectric layer 216 on a sidewall of the semiconductor pillar 214; and forming the wordline 205 on a periphery of the gate dielectric layer 216, the wordline 205 exposing a sidewall and a top at the other end of the semiconductor pillar 214.

Figure 14:
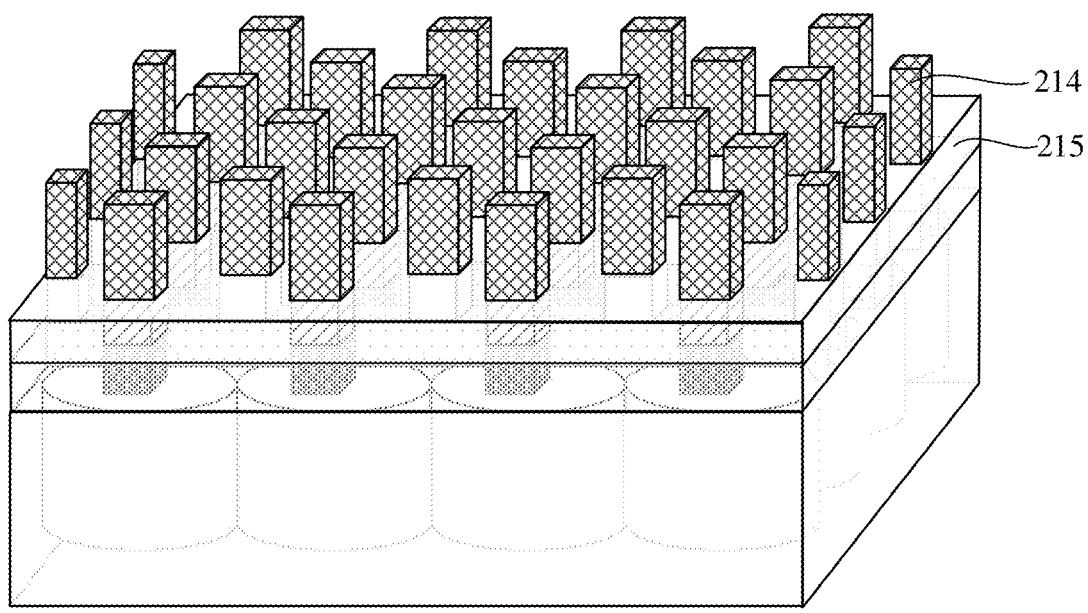
Figure 15:
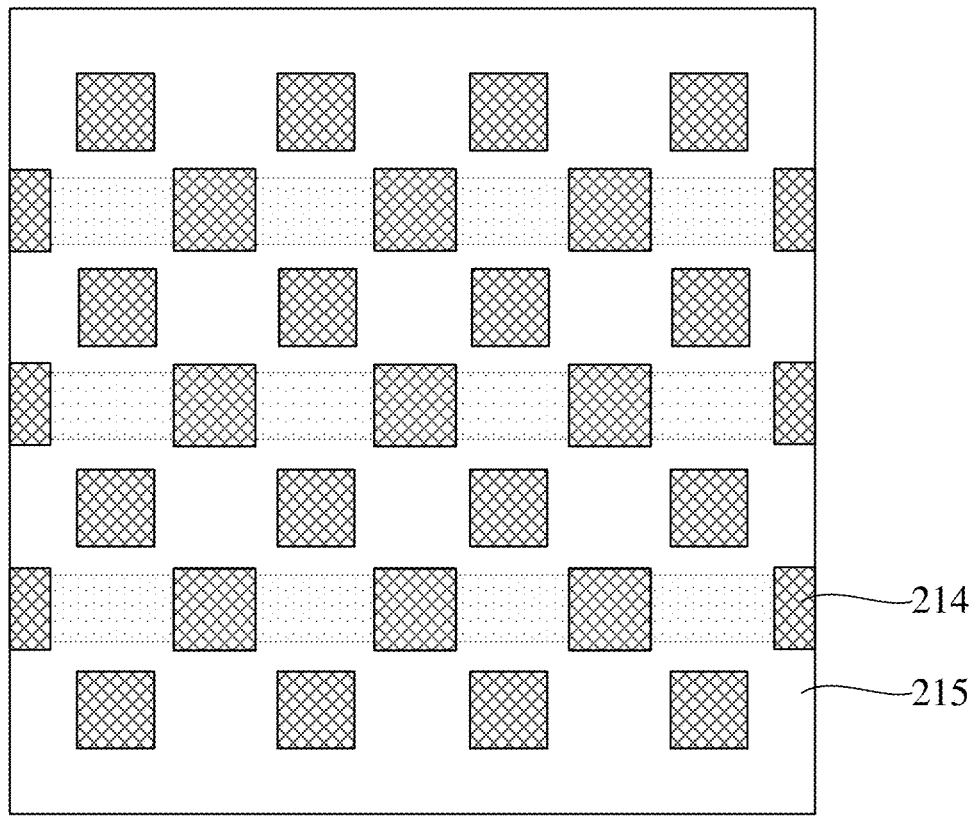

In an optional embodiment, referring to FIG. 14 and FIG. 15, FIG. 15 is a top view of the semiconductor structure of FIG. 14. A gap between the source 207 and the drain 208 is filled with an insulation material to form a third insulation layer 215. The third insulation layer 215 exposes tops of the source 207 and the drain 208. The semiconductor pillar 214 is formed on the source 207 and the drain 208.

The semiconductor pillar 214 is connected to the source 207 or the drain 208 at the lower end of the transistor 209.

In an optional embodiment, the semiconductor pillar 214 is made of silicon. In other embodiments, the semiconductor pillar may be made of germanium or other semiconductor materials.

In this embodiment, the step of forming a semiconductor pillar 214 includes: depositing a layer of semiconductor material on the third insulation layer 215, and patterning the semiconductor material to form the semiconductor pillar 214. In this way, the semiconductor pillar 214 is formed faster.

Figure 16:
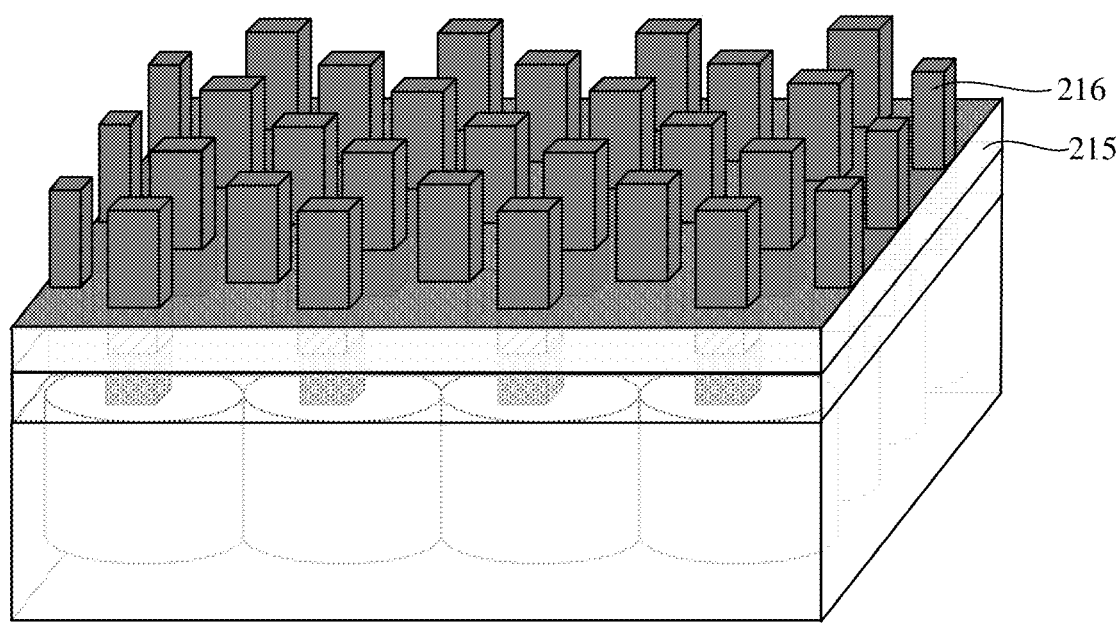
Figure 17:
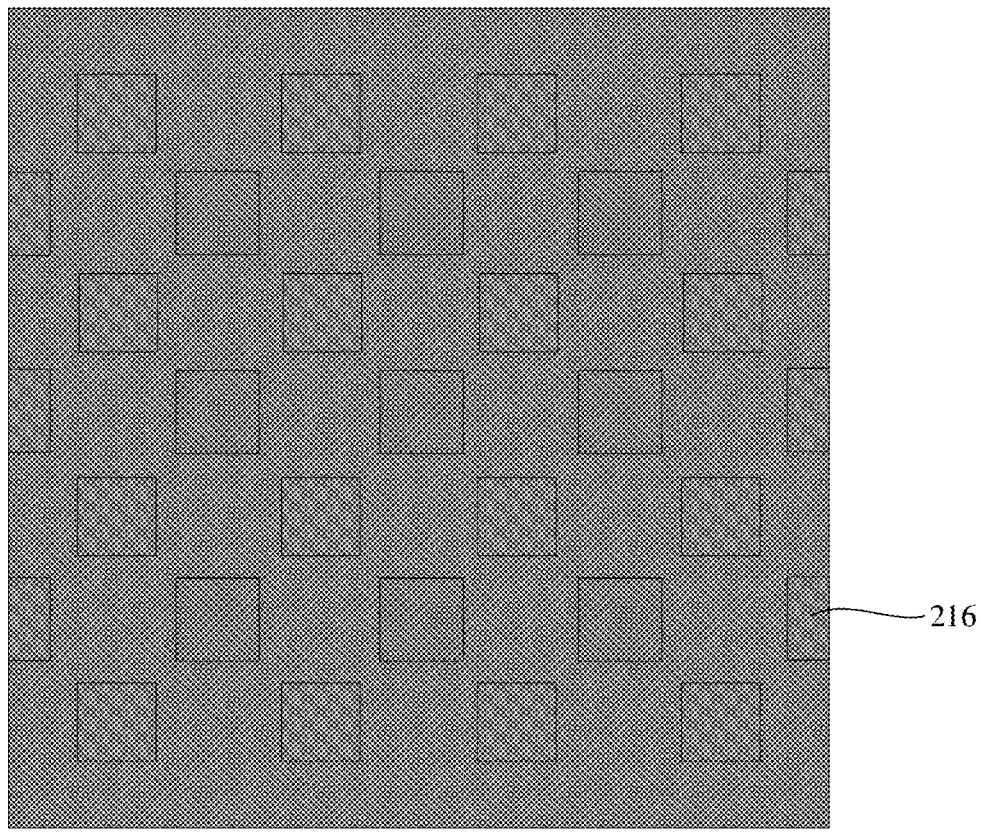

In an optional embodiment, referring to FIG. 16 and FIG. 17, FIG. 17 is a top view of the semiconductor structure in FIG. 16. A gate dielectric material is deposited on a sidewall and an upper surface of the semiconductor pillar 214 (refer to FIG. 14 to FIG. 15) and an upper surface of the third insulation layer 215 to form the gate dielectric layer 216 covering the sidewall of the semiconductor pillar 214.

Figure 18:
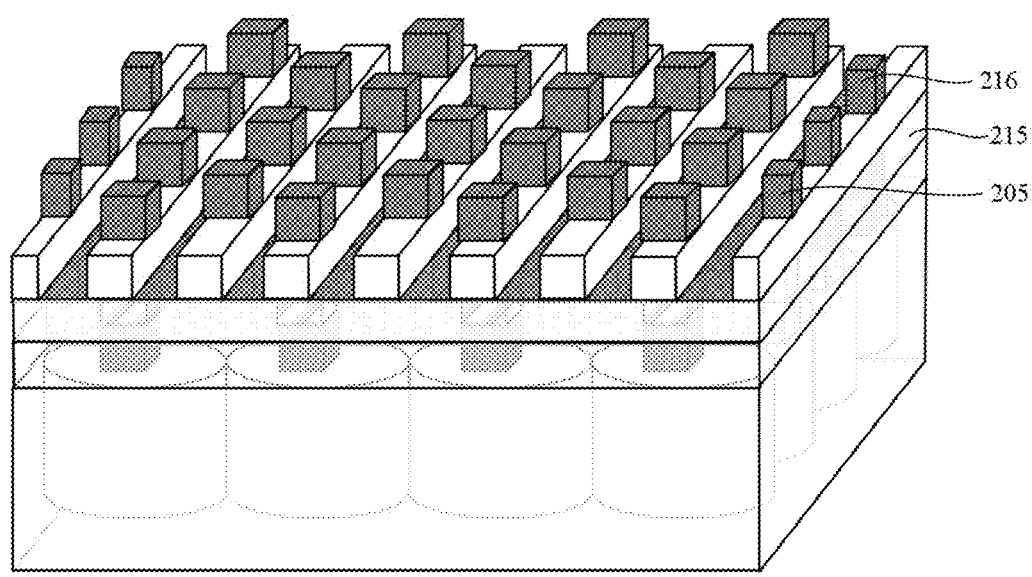
Figure 19:
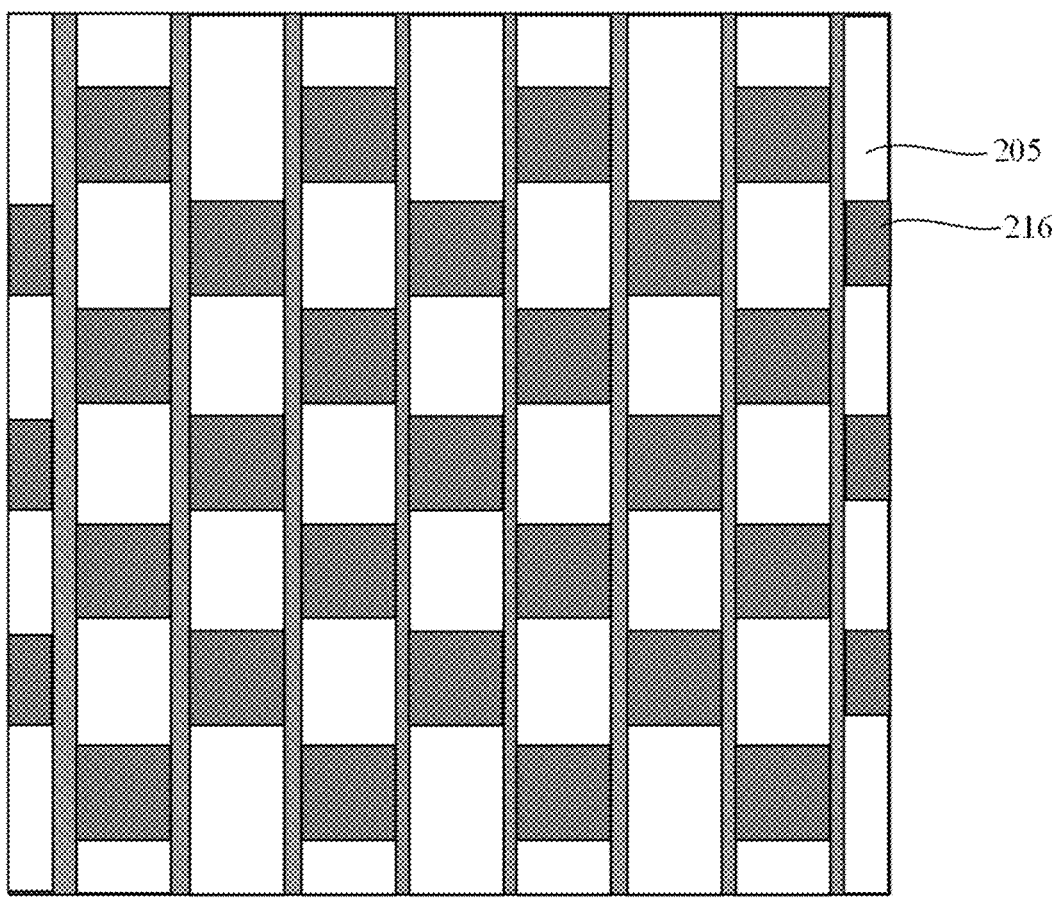

In an optional embodiment, referring to FIG. 18 and FIG. 19, FIG. 19 is a top view of the semiconductor structure in FIG. 18. A layer of gate material is formed on the third insulation layer 215, and the gate material is patterned to form separate wordlines 205. An extension direction of the wordline 205 is perpendicular to an extension direction of the second bitline 203.

The wordline 205 covers only a part of the semiconductor pillar 214 (refer to FIG. 14 to FIG. 15), and exposes the gate dielectric material on a sidewall and a top at the other end of the semiconductor pillar 214.

Figure 20:
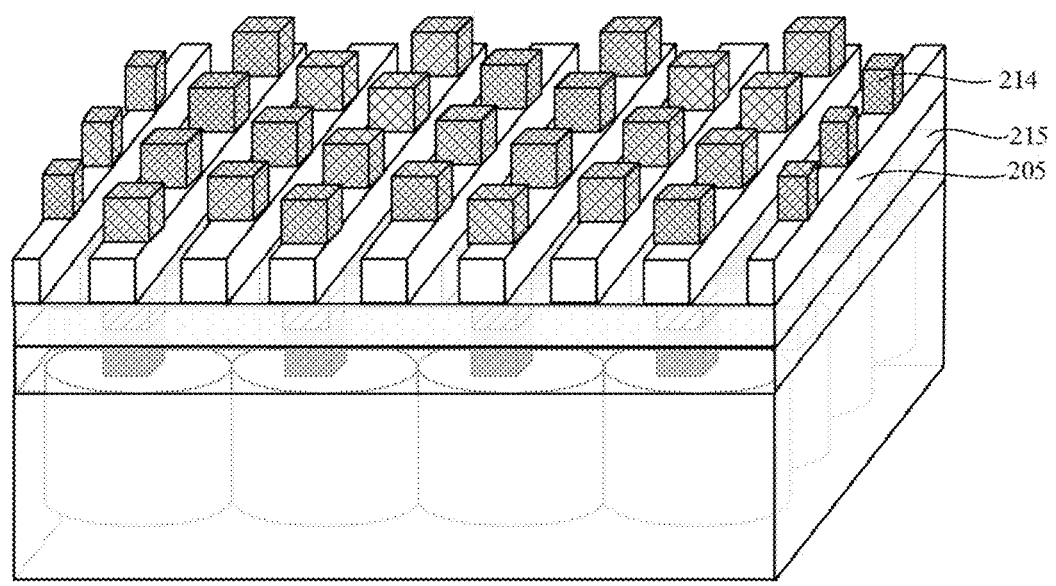
Figure 21:
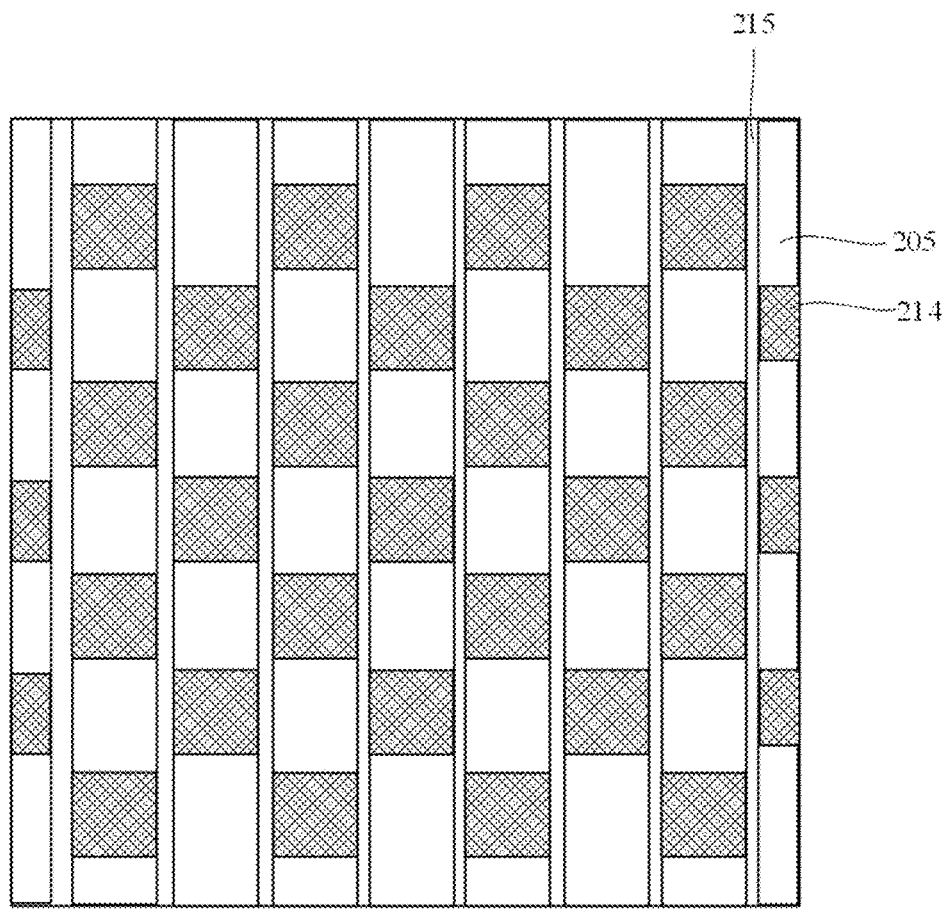

In an optional embodiment, referring to FIG. 20 and FIG. 21, FIG. 21 is a top view of the semiconductor structure of FIG. 20. The gate dielectric material on the upper surface of the third insulation layer 215 and the gate dielectric material exposed by the wordline 205 are removed to expose the semiconductor pillar 214 above the wordline.

Figure 22:
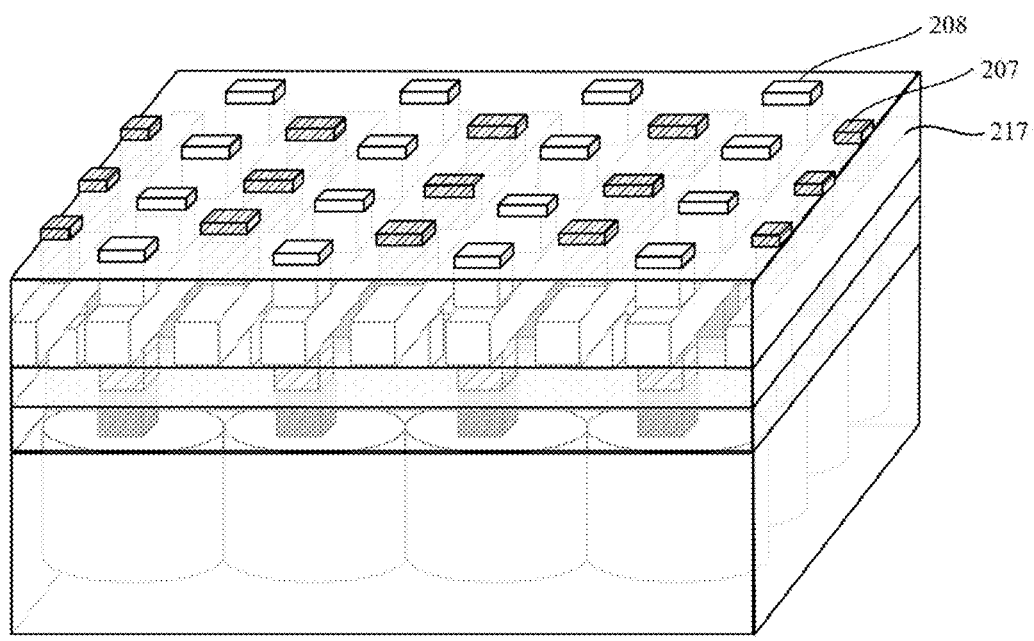
Figure 23:
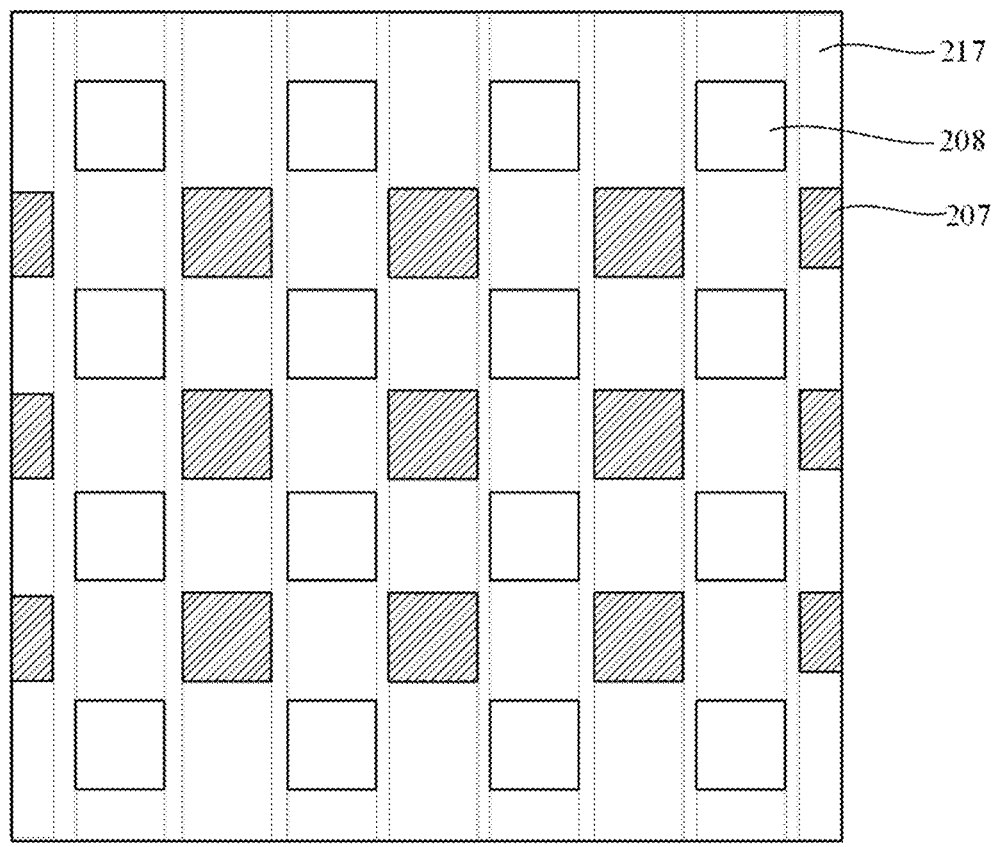

In an optional embodiment, referring to FIG. 22 and FIG. 23, FIG. 23 is a top view of the semiconductor structure of FIG. 22. The step of forming the source 207 or the drain 208 at the other end of the transistor 209 (refer to FIG. 28) includes: filling a gap between the wordline 205 and the semiconductor pillar 214 to form an isolation layer 217, the isolation layer 217 exposing the top of the semiconductor pillar 214 (refer to FIG. 22 to FIG. 23); and performing source and drain ion implantation on the exposed top of the semiconductor pillar 214 to form the source 207 or the drain 208 at the other end of the transistor 209 (refer to FIG. 28).

In an optional embodiment, the isolation layer 217 is made of an insulation material such as silicon dioxide or silicon nitride.

In an optional embodiment, source ions and drain ions are the same in variety and concentration. In other embodiments, the source ions and the drain ions may also be different in variety and concentration.

Figure 24:
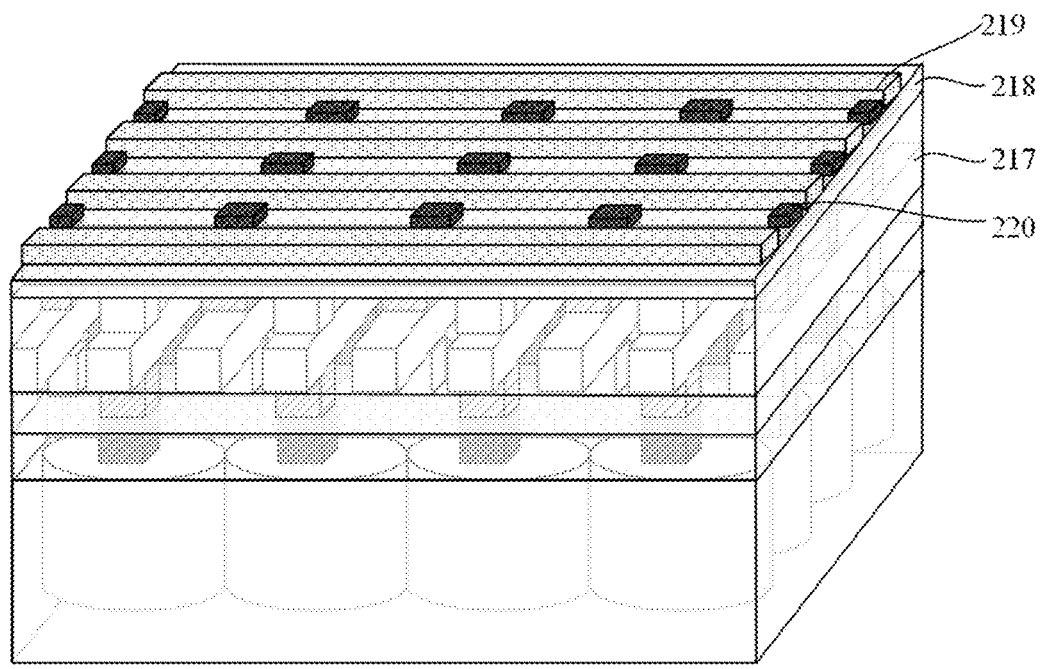
Figure 25:
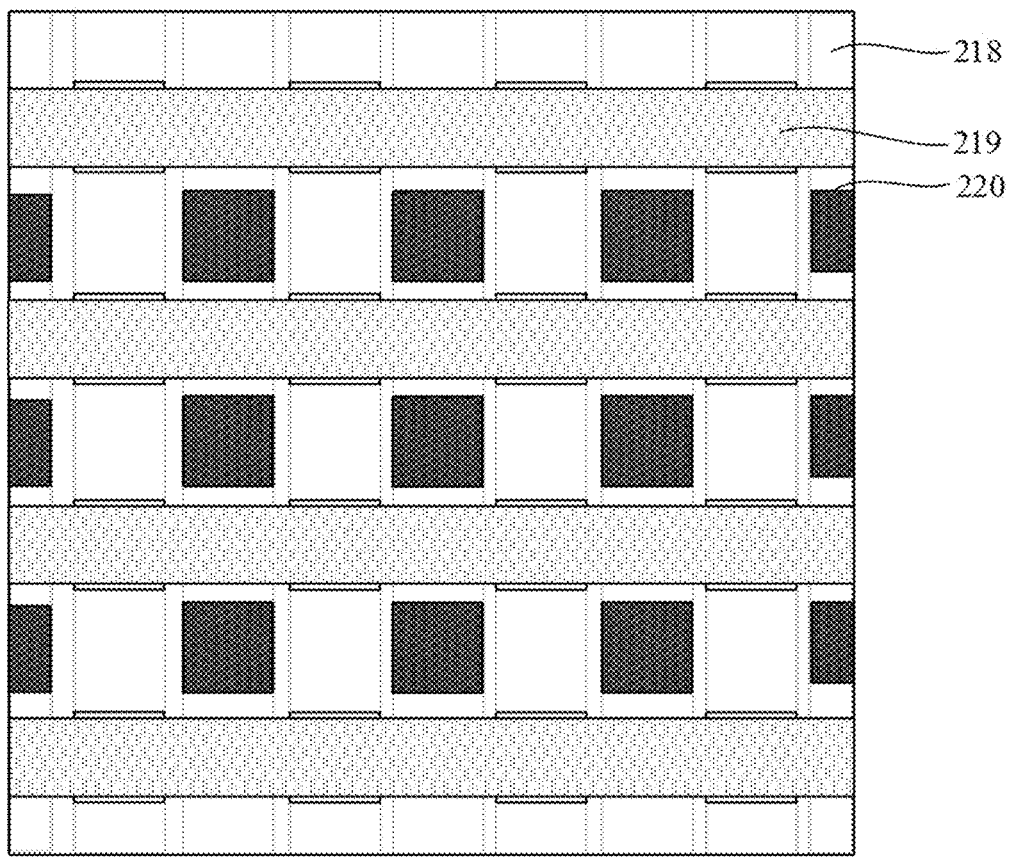

In an optional embodiment, referring to FIG. 24 and FIG. 25, FIG. 25 is a top view of the semiconductor structure of FIG. 24. A first bitline 219 is formed on the transistor 209 (refer to FIG. 28) and the wordline 205 (refer to FIG. 20 to FIG. 21). An extension direction of the first bitline 219 is perpendicular to an extension direction of the wordline 205.

The step of forming a first bitline 219 includes: forming a first insulation layer 218 on the transistor 209 and the wordline 205, forming a first trench on the first insulation layer 218, and forming the first bitline 219 in the first trench.

In an optional embodiment, the first insulation layer 218 is formed by chemical vapor deposition or physical vapor deposition. In other embodiments, other deposition technologies may also be adopted.

The first trench is formed by etching, and the first trench is filled with a material to form the first bitline 219. In this embodiment, the first bitline 219 is partially located in the first trench and partially higher than the first trench. In other embodiments, the first bitline may also be wholly located in the first trench.

In an optional embodiment, the first bitline 219 is electrically connected to the drain 208 (refer to FIG. 22 to FIG. 23) at an upper end of the transistor 209. In other embodiments, the first bitline may also be electrically connected to the source at the upper end of the transistor.

A contact hole is formed on the first insulation layer 218, and a second memory node contact 220 is formed in the contact hole.

In an optional embodiment, the second memory node contact 220 is partially located in the contact hole and partially higher than the contact hole.

In an optional embodiment, the second memory node contact may also be wholly located in the contact hole.

The second memory node contact 220 is electrically connected to the source 207 (refer to 22 to FIG. 23) at the upper end of the transistor 209. In other embodiments, the second memory node contact may also be electrically connected to the drain at the upper end of the transistor.

Figure 26:
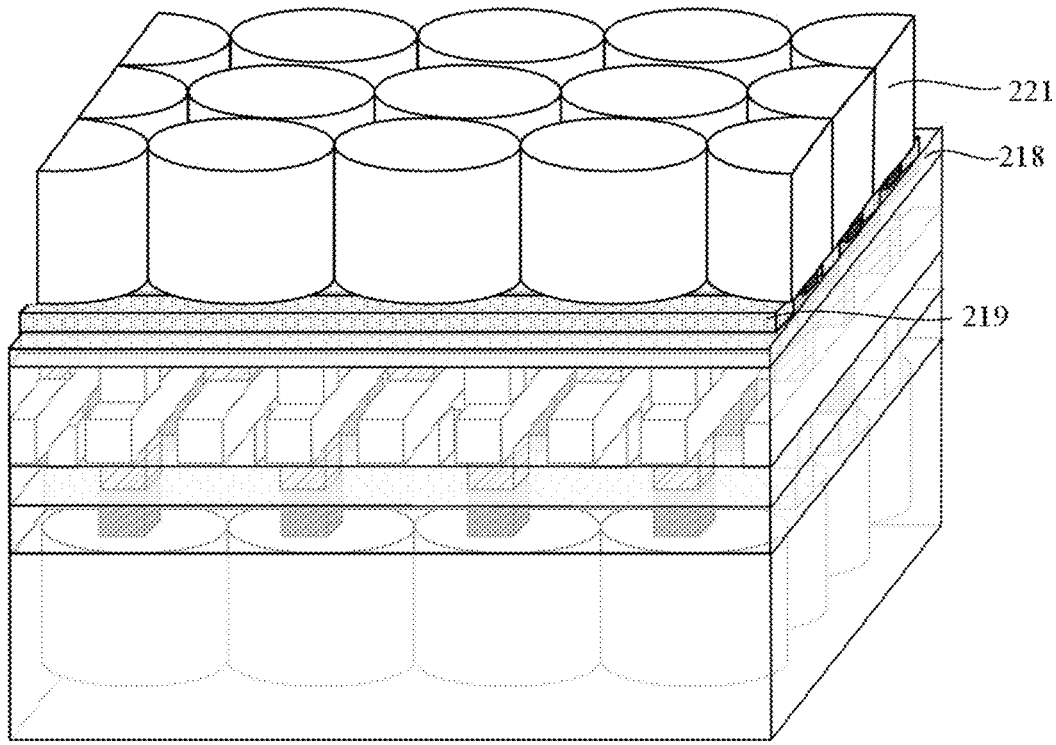
Figure 27:
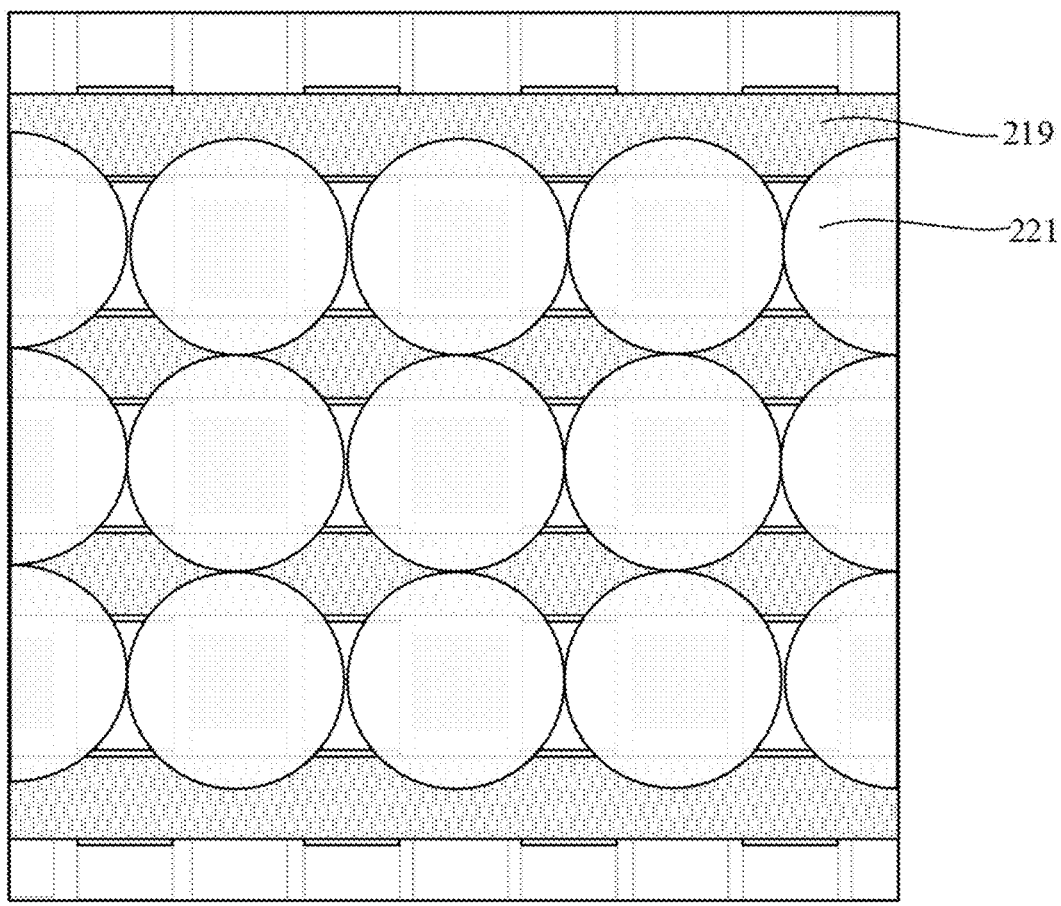

In an optional embodiment, referring to FIG. 26 and FIG. 27, FIG. 27 is a top view of the semiconductor structure of FIG. 26. A second memory structure 221 is formed on the first bitline 219.

Figure 28:
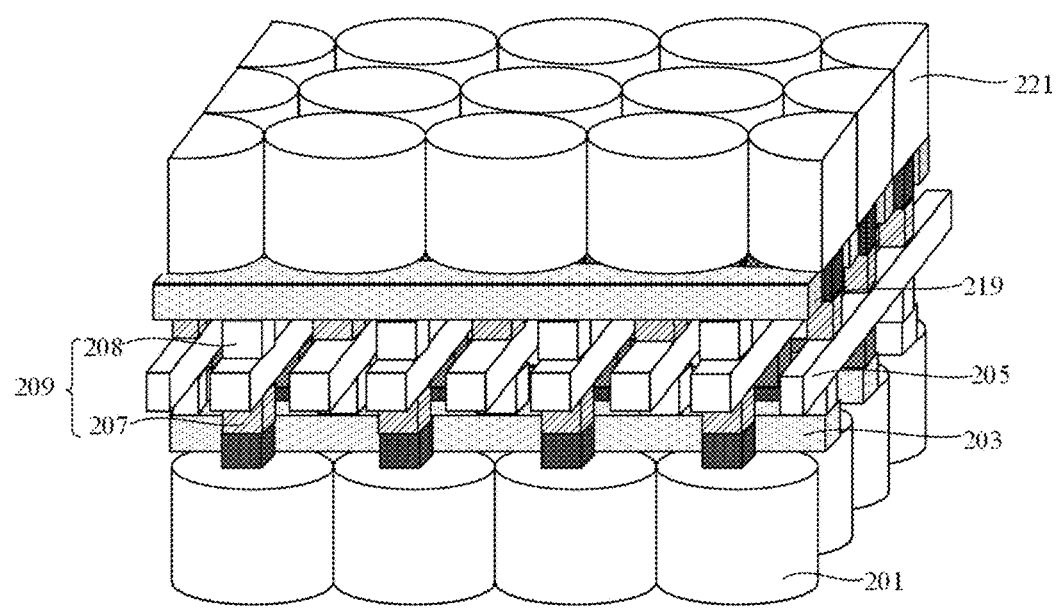

In an optional embodiment, referring to FIG. 28, FIG. 28 shows a semiconductor structure manufactured with a manufacturing method according to this embodiment. The first bitline 219 and the second bitline 203 are connected to the first memory structure 201 and the second memory structure 221 respectively through the transistor 209, and the first memory structure 201 and the second memory structure 221 are staggered. In this way, the internal space of the memory can be fully utilized, the storage capacity is increased, and then the performance of the memory is improved. In addition, an extension direction of the first bitline 219 is the same as an extension direction of the second bitline 203, and the extension direction of the first bitline 219 is perpendicular to an extension direction of the wordline 205. In this way, an area of overlap of the wordline 205 with the first bitline 219 and the second bitline 203 is minimum, and the interference is the least. Therefore, the memory can also maintain good stability while the storage capacity is increased.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A semiconductor structure, comprising:
   a wordline; and
   a first bitline and a second bitline located on two sides of the wordline and a first memory structure and a second memory structure located on the two sides of the wordline, the first bitline and the second bitline being connected to the first memory structure and the second memory structure respectively through a transistor;
   a first memory node contact and a second memory node contact; the first memory structure being connected to a source or a drain of the transistor through the first memory node contact, and the second memory structure being connected to the source or the drain of the transistor through the second memory node contact;
   an extension direction of the first bitline being perpendicular to an extension direction of the wordline; and,
   wherein the transistor is a vertical transistor, a middle of the transistor is coated with the wordline.

2. The semiconductor structure according to claim 1, wherein the transistor comprises a first transistor and a second transistor, two ends of the first transistor are connected to the first bitline and the first memory structure respectively, and two ends of the second transistor are connected to the second bitline and the second memory structure respectively.

3. The semiconductor structure according to claim 2, wherein the first bitline and the second memory structure are located on one side of the transistor, and the second bitline and the first memory structure are located on the other side of the transistor.

4. The semiconductor structure according to claim 3, wherein the transistor connected to a same wordline is connected to one of the first memory structure and the second memory structure.

5. The semiconductor structure according to claim 4, wherein the wordline corresponding to the first memory structure and the wordline corresponding to the second memory structure are arranged alternately.

6. The semiconductor structure according to claim 1, wherein the first memory node contact and the second bitline are located on a same layer, and the second memory node contact and the first bitline are located on a same layer.

7. The semiconductor structure according to claim 1, further comprising: a first bitline node contact and a second bitline node contact; the first bitline being connected to a source or a drain of the transistor through the first bitline node contact, and the second bitline being connected to the source or the drain of the transistor through the second bitline node contact.

8. The semiconductor structure according to claim 1, wherein the wordline, the first bitline, the second bitline, the first memory structure and the second memory structure are located in different layers respectively.

9. The semiconductor structure according to claim 1, wherein the extension direction of the first bitline is the same as an extension direction of the second bitline.

10. A semiconductor structure manufacturing method, comprising:
    providing a substrate, and forming a first memory structure on the substrate;
    forming a second bitline on the first memory structure; and forming a transistor and a wordline on the second bitline, the transistor comprising a source, a drain and a channel region, the channel region of the transistor being connected to the wordline;

forming a first bitline on the transistor and the wordline; and forming a second memory structure on the first bitline, wherein the first bitline and the second bitline are connected to the first memory structure and the second memory structure respectively through the transistor; and an extension direction of the first bitline is perpendicular to an extension direction of the wordline; and, wherein a first memory node contact is further formed after the first memory structure is formed; and a second memory node contact is further formed before the second memory structure is formed.

11. The semiconductor structure manufacturing method according to claim 10, wherein the step of forming a first bitline comprises: forming a first insulation layer on the transistor and the wordline, forming a first trench on the first insulation layer, and forming the first bitline in the first trench; and the step of forming a second bitline comprises: forming a second insulation layer on the first memory structure, forming a second trench on the second insulation layer, and forming the second bitline in the second trench.

12. The semiconductor structure manufacturing method according to claim 10, wherein the step of forming a wordline comprises: forming a semiconductor pillar on the source or the drain at one end of the transistor; forming a gate dielectric layer on a sidewall of the semiconductor pillar; and forming the wordline on a periphery of the gate dielectric layer, the wordline exposing a sidewall and a top at the other end of the semiconductor pillar.

13. The semiconductor structure manufacturing method according to claim 12, wherein the step of forming the source or the drain at the other end of the transistor comprises: filling a gap between the wordline and the semiconductor pillar to form an isolation layer, the isolation layer exposing the top of the semiconductor pillar; and performing ion implantation at the exposed top of the semiconductor pillar to form the source or the drain at the other end of the transistor.

* * * * *